(12) United States Patent
Edwards

(10) Patent No.: US 8,994,056 B2
(45) Date of Patent: Mar. 31, 2015

(54) LED-BASED LARGE AREA DISPLAY

(71) Applicant: Intematix Corporation, Fremont, CA (US)

(72) Inventor: Charles Edwards, Pleasanton, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 13/941,236

(22) Filed: Jul. 12, 2013

(65) Prior Publication Data

US 2014/0014983 A1   Jan. 16, 2014

Related U.S. Application Data

(60) Provisional application No. 61/671,585, filed on Jul. 13, 2012.

(51) Int. Cl.
*G01L 27/02* (2006.01)
*H01L 27/15* (2006.01)
(Continued)

(52) U.S. Cl.
CPC ............... *H01L 27/156* (2013.01); *G09F 9/33* (2013.01); *Y10S 977/774* (2013.01); *Y10S 977/95* (2013.01); *B82Y 20/00* (2013.01)
USPC ........ 257/98; 257/89; 257/100; 257/E21.141; 977/774; 977/950

(58) Field of Classification Search
CPC ...................................................... H01L 27/156
USPC .......................................... 257/40, 89, 79, 98
See application file for complete search history.

(56) References Cited

U.S. PATENT DOCUMENTS 3,290,255 A   12/1966   Smith
3,593,055 A   7/1971   Geusic et al.
(Continued)

FOREIGN PATENT DOCUMENTS

EP   647694   4/1995
GB   2 017 409   10/1979
(Continued)

OTHER PUBLICATIONS

The International Search Report mailed on Aug. 23, 2012 for PCT/US2011/063057.
(Continued)

*Primary Examiner* — Michael Lebentritt
(74) *Attorney, Agent, or Firm* — Vista IP Law Group, LLP

(57) ABSTRACT

An improved approach is described to implement an LED-based large area display which uses an array of single color solid state lighting elements (e.g. LEDs). In some embodiments, the panel comprises an array of blue LEDs, where each pixel of the array comprises three blue LEDs. An overlay is placed over the array of blue LEDs, where the overlay comprises a printed array of phosphor portions. Each pixel on the PCB comprised of three blue LEDs is matched to a corresponding portion of the overlay having the printed phosphor portions. The printed phosphor portions of the overlay includes a number of regions of blue light excitable phosphor materials that are configured to convert, by a process of photoluminescence, blue excitation light generated by the light sources into green or red and colored light. Regions of the overlay associated with generating blue light comprise an aperture/window that allows blue light to pass through the overlay.

20 Claims, 10 Drawing Sheets

(51) Int. Cl.
 G09F 9/33 (2006.01)
 B82Y 20/00 (2011.01)

(56) References Cited

U.S. PATENT DOCUMENTS

| | | |
|---|---|---|
| 3,670,193 A | 6/1972 | Thorington et al. |
| 3,676,668 A | 7/1972 | Collins et al. |
| 3,691,482 A | 9/1972 | Pinnow et al. |
| 3,709,685 A | 1/1973 | Hercock et al. |
| 3,743,833 A | 7/1973 | Martic et al. |
| 3,763,405 A | 10/1973 | Mitsuhata |
| 3,793,046 A | 2/1974 | Wanmaker et al. |
| 3,819,973 A | 6/1974 | Hosford |
| 3,819,974 A | 6/1974 | Stevenson et al. |
| 3,849,707 A | 11/1974 | Braslau et al. |
| 3,875,456 A | 4/1975 | Kano et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schoberl |
| 4,081,764 A | 3/1978 | Christmann et al. |
| 4,104,076 A | 8/1978 | Pons |
| 4,143,394 A | 3/1979 | Schoberl |
| 4,176,294 A | 11/1979 | Thornton, Jr. |
| 4,176,299 A | 11/1979 | Thornton |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay, Jr. et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter, Jr. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,959,316 A | 9/1999 | Lowery |
| 5,962,971 A | 10/1999 | Chen |
| 5,998,925 A | 12/1999 | Shimizu |
| 6,072,272 A * | 6/2000 | Rumbaugh ............... 313/470 |
| 6,137,217 A | 10/2000 | Pappalardo et al. |
| 6,340,824 B1 | 1/2002 | Komoto et al. |
| 6,504,301 B1 | 1/2003 | Lowery |
| 6,576,488 B2 | 6/2003 | Collins et al. |
| 6,600,175 B1 | 7/2003 | Baretz et al. |
| 6,642,618 B2 | 11/2003 | Yagi et al. |
| 6,642,652 B2 | 11/2003 | Collins et al. |
| 6,869,812 B1 | 3/2005 | Liu |
| 7,153,015 B2 | 12/2006 | Brukilacchio |
| 7,311,858 B2 | 12/2007 | Wang |
| 7,390,437 B2 | 6/2008 | Dong |
| 7,479,662 B2 | 1/2009 | Soules et al. |
| 7,575,697 B2 | 8/2009 | Li |
| 7,601,276 B2 | 10/2009 | Li |
| 7,615,795 B2 | 11/2009 | Baretz et al. |
| 7,655,156 B2 | 2/2010 | Cheng |
| 7,863,808 B2 * | 1/2011 | Terao ........................ 313/501 |
| 7,937,865 B2 * | 5/2011 | Li et al. ..................... 40/542 |
| 7,943,945 B2 | 5/2011 | Baretz et al. |
| 8,044,575 B2 * | 10/2011 | Kawamura .................. 313/504 |
| 8,274,215 B2 * | 9/2012 | Liu et al. ................... 313/504 |
| 8,400,396 B2 | 3/2013 | Feng et al. ................. 345/102 |
| 8,539,702 B2 * | 9/2013 | Li et al. ..................... 40/564 |
| 8,618,559 B2 * | 12/2013 | Hamaguchi et al. ........ 257/79 |
| 8,631,598 B2 * | 1/2014 | Li et al. ..................... 40/542 |
| 8,795,817 B2 | 8/2014 | Kwak et al. |
| 8,796,050 B2 | 8/2014 | Yoo et al. |
| 8,796,712 B2 | 8/2014 | Ooyabu et al. |
| 2001/0019240 A1 | 9/2001 | Takahashi |
| 2004/0016938 A1 | 1/2004 | Baretz et al. |
| 2006/0049416 A1 | 3/2006 | Baretz et al. |
| 2006/0158090 A1 | 7/2006 | Wang et al. |
| 2007/0031097 A1 | 2/2007 | Heikenfeld et al. |
| 2007/0138438 A1 | 6/2007 | Hampden-Smith et al. |
| 2007/0240346 A1 | 10/2007 | Li et al. |
| 2008/0111472 A1 | 5/2008 | Liu et al. |
| 2008/0116785 A1 | 5/2008 | Ohno et al. |
| 2008/0218992 A1 | 9/2008 | Li |
| 2008/0224597 A1 | 9/2008 | Baretz et al. |
| 2008/0224598 A1 | 9/2008 | Baretz et al. |
| 2009/0283721 A1 | 11/2009 | Liu et al. |
| 2010/0079980 A1 * | 4/2010 | Sakai .......................... 362/97.1 |
| 2010/0301758 A1 * | 12/2010 | Chen .......................... 315/154 |
| 2010/0321339 A1 * | 12/2010 | Kimmel ..................... 345/175 |
| 2011/0261290 A1 * | 10/2011 | Kim et al. .................. 349/64 |

FOREIGN PATENT DOCUMENTS

| | | |
|---|---|---|
| JP | S50-79379 | 11/1973 |
| JP | 60170194 | 9/1985 |
| JP | 862-189770 | 8/1987 |
| JP | H01-179471 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | P2003-234513 | 8/2003 |
| JP | P3724490 | 9/2005 |

(56) References Cited

FOREIGN PATENT DOCUMENTS

| JP | P3724498 | 9/2005 |
|---|---|---|
| WO | WO 9108508 | 6/1991 |
| WO | WO 2010074963 A1 | 7/2010 |

OTHER PUBLICATIONS

International Preliminary Report on Patentability and Written Opinion of the International Searching Authority mailed on Aug. 23, 2012 for PCT/US2011/063057.
Non-Final Office Action dated Aug. 19, 2013 for U.S. Appl. No. 13/308,066.
Final Office Action dated Apr. 15, 2014 for U.S. Appl. No. 13/308,066.
"Fraunhofer-Gesellschafl: Research News Special1997", http://www.fhg.de/press/md-e/md1997/sondert2.hlm,(accessed on Jul. 23, 1998), Jan. 1997, Publisher: Fraunhofer Institute.
Adachi, C. et al., "Blue light-emitting organic electroluminescent devices", "Appl. Phys. Lett.", Feb. 26, 1990, pp. 799-801, vol. 56, No. 9.
Akasaki, Isamu, et al., "Photoluminescence of Mg-doped p-type GaN and electroluminescence of GaN p-n. junction LED", "Journal of Luminescence", Jan.-Feb. 1991, pp. 666-670, vol. 48-49 pt. 2.
Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.
Apr. 14, 2010 Office Action in U.S. Appl. No. 11/264,124, issued by Examiner Abu I Kalam.
Apr. 15, 2009 Office Action in U.S. Appl. No. 11/264,124, issued by Abu I Kalam.
Armaroli, N. et al., "Supramolecular Photochemistry and Photophysics. ", "J. Am. Chern. Soc.", 1994, pp. 5211-5217, vol. 116.
Aug. 21, 2006 Office Action in U.S. Appl. No. 10/623,198, issued by Thao X. Le.
Aug. 24, 2007 Office Action in U.S. Appl. No. 11/264,124, issued by Thao X. Le.
Aug. 26, 2010 Office Action in U.S. Appl. No. 12/131,118, issued by Examiner Abul Kalam.
Berggren, M. et al., "Light-emitting diodes with variable colours from polymer blends", "Nature", Dec. 1, 1994, pp. 444-446, vol. 372.
Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.
Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.
Bradfield, P.L., et al., "Electroluminescence from sulfur impurities in a p-n junction formed in epitaxial silicon", "Appl. Phys. Lett", 07110/1989, pp. 10D-102, vol. 55, No. 2.
Chao, Zhang Jin, et al., "White light emitting glasses", "Journal of Solid State Chemistry", 1991, pp. 17-29, vol. 93.
Comrie, M. , "Full Color LED Added to Lumex's Lineup", "EBN", Jun. 19, 1995, p. 28.
CRC Handbook, 63rd Ed., (1983) p. E-201.
Das, N.C., et al., "Luminescence spectra of ann-channel metal-oxide-semiconductor field-effect transistor at breakdown", 1990, pp. 1152-1153, vol. 56, No. 12.
Dec. 16, 2004 Office Action in U.S. Appl. No. 10/623,198, issued by Thao X. Le.
Dictionary Definition of Phosphor, Oxford English Dictionary Online, Mar. 9, 2012 (Only partial available due to corrupt file, on Mar. 22, 2012 in U.S. Appl. No. 12/131,119; Request for Full Reference filed).
El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.
Feb. 21, 2012 Office Action in U.S. Appl. No. 12/131,118, issued by Abul Kalam.
Feb. 26, 2008 Office Action in U.S. Appl. No. 11/264,124, issued by Abu I Kalam.
Feb. 4, 2005 Office Action in U.S. Appl. No. 10/623,198, issued by Thao X. Le.
Feb. 7, 2007 Office Action in U.S. Appl. No. 11/264,124, issued by Thao X. Le.
Forrest, S. et al. , "Organic emitters promise a new generation of displays", "Laser Focus World ", Feb. 1995, pp. 99-107.
Hamada, Y. et al. , "Blue-Light-Emitting Organic Electroluminescent Devices with Oxadiazole Dimer Dyes as an Emitter", "Jpn. J. Appl. Physics", Jun. 1992, pp. 1812-1816, vol. 31.
Hamakawa, Yoshihiro, et al., "Toward a visible light display by amorphous SiC:H alloy system", "Optoelectronics—Devices and Technologies", Dec. 1989, pp. 281-294, vol. 4, No. 2.
Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.
Jang, S., "Effect of Avalanche-Induced Light Emission on the Multiplication Factor in Bipolar Junction Transistors", "Solid-State Electronics", 1991, pp. 1191-1196, vol. 34, No. 11.
Jan. 29, 2007 Office Action in U.S. Appl. No. 10/623,198, issued by Thao X. Le.
Jan. 30, 2006 Office Action in U.S. Appl. No. 11/264,124, issued by Thao X. Le.
Jan. 7, 2011 Office Action in U.S. Appl. No. 12/131,119, issued by Steven Y. Horikoshi.
Jul. 10, 2008 Office Action in U.S. Appl. No. 11/264,124, issued by Abu I Kalam.
Jul. 14, 2005 Notice of Allowance, Notice of Allowability, and Examiner's Statement of Reasons for Allowance in U.S. Appl. No. 10/623,198, issued by Thao X. Le.
Jul. 14, 2011 Office Action in U.S. Appl. No. 12/131,119, issued by Steve Horikoshi.
Jul. 7, 2011 Office Action in U.S. Appl. No. 12/131,118, issued by Abu I Kalam.
Jun. 14, 2006 Office Action in U.S. Appl. No. 11/264,124, issued by Thao X. Le.
Jun. 26, 2007 Office Action in U.S. Appl. No. 10/623,198, issued by Thao X. Le.
Kido, J. et al. , "1,2,4-Triazole Derivative as an Electron Transport Layer in Organic Luminescent Devices", "Jpn. J. Appl. Phys.", Jul. 1, 1993, pp. L917-L920, vol. 32.
Kido, J. et al. , "Bright blue electroluminescence from poly(N-vinylcarbazole)", "Appl. Phys. Letters", Nov. 8, 1993, pp. 2627-2629, vol. 63, No. 19.
Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.
Krames, M., et al., "Status and Future of High-Power Light-Emitting Diodes for Solid-Slate Lighting", "Journal of Display Technology", Jun. 2007, pp. 160-175, vol. 3, No. 2.
Kudryashov, V., et al., "Spectra of Superbright Blue and Green InGaN/AlGaN/GaN Light-Emitting diodes", "Journal of the European Ceramic Society", May 1996, pp. 2033-2037, vol. 17.
Larach, S., et al., "Blue emitting luminescent phosphors: Review and status", "Int'l Workshop on Electroluminescence", 1990, pp. 137-143.
LEDs and Laser Diodes, Electus Distribution, copyright 2001, available at URL:http://www.jaycar.com.au/images_uploaded/ledlaser.Pdf.
Lester, S., et al., "High dislocation densities in high efficiency GaN-based light-emitting diodes", "Appl. Phys. Lett.", Mar. 6, 1995, pp. 1249-1251, vol. 66, No. 10.
Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdt?title=Technicai%20Datasheet&asset_type=pds/pdf&language=EN&urn=urn: documentum:eCommerce_soi_EU:09007bb280021e27.pdf :09007bb280021e27.pdf.
Mar. 2, 2009 Office Action in U.S. Appl. No. 10/623,198, issued by Abu I Kalam.

(56) References Cited

OTHER PUBLICATIONS

Mar. 22, 2012 Office Action in U.S. Appl. No. 12/131,119, issued by Steven Y. Horikoshi.
Mar. 28, 2006 Office Action in U.S. Appl. No. 10/623,198, issued by Thao X. Le.
Mar. 4, 2011 Notice of Allowance, Notice of Allowability, Examiner's Interview Summary, Examiner's Amendment/ Comment and Examiner's Statement of Reason for Allowance in U.S. Appl. No. 11/264,124, issued by Abu I Kalam.
Mar. 7, 2008 Office Action in U.S. Appl. No. 10/623,198, issued by Abu I Kalam.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.
May 4, 2010 Office Action in U.S. Appl. No. 12/131,119.
McGraw-Hill, "McGraw-Hill Dictionary of Scientific and Technical Terms, Third Edition", "McGraw-Hill Dictionary of Scientific and Technical Terms", 1984, p. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, p. 582 and 60-63, vol. 9-10, Publisher: McGraw-Hill.
Mimura, Hidenori, et al., "Visible electroluminescence from uc-SiC/ porous Si/c-Si p-n. junctions", "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, pp. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Nov. 30. 2010 Office Action in U.S. Appl. No. 12/131,118.
Oct. 20, 2008 Office Action in U.S. Appl. No. 10/623,198, issued by Abu I Kalam.
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn a Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiner's Amendmeni/Comment, and Examiner's Statement of Reasons for Allowance in U.S. Appl. No. 10/623,198, issued by Abul Kalam.
Sep. 29, 2009 Office Action in U.S. Appl. No. 11/264,124, issued by Abu I Kalam.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315,437-438, 509-510, copyright 1979, 1988, and 1998.
Ura, M. , "Recent trends of development of silicon monocarbide blue-light emission diodes", "Kinzoku", 1989, pp. 11-15, vol. 59, No. 9.
Werner, K. , "Higher Visibility for LEDs", "IEEE Spectrum", Jul. 1994, pp. 30-39.
Wojciechowski, J. et al. , "Infrared-To-Blue Up-Converting Phosphor", "Electron Technology", 1978, pp. 31-47, vol. 11, No. 3.
Yamaguchi, Y. et al., "High-Brightness SiC Blue LEDs and Their Application to Full Color LED Lamps", "Optoelectronics-Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics—Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol. ", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.

\* cited by examiner

SECTION A-A

LED-BASED LARGE AREA DISPLAY

CROSS-REFERENCE TO RELATED APPLICATIONS

The present application claims the benefit of U.S. Provisional Application No. 61/671,585, filed on Jul. 13, 2012, which is hereby incorporated by reference in its entirety.

BACKGROUND OF THE INVENTION

1. Field of the Invention

This invention relates to large area (format) color displays and lighting panels that incorporate solid-state light emitters such as Light Emitting Diodes (LEDs).

2. Description of the Related Art

There are many types of light generating systems that can be used to implement large format digital color displays and other forms of entertainment lighting products. For example, one common approach is to provide a panel having an array of LEDs lights, where each "pixel" on the panel is composed of three individual red emitting, green emitting, and blue emitting LEDs. FIG. 1 illustrates an example configuration 100 of three LEDs that would be implemented on a panel as a pixel, including a red LED 104, green LED 102, and blue LED 106. Typically as indicated each LED can comprise a 10 mm LED, The overall image displayed by the panel would be configured by controlling which of the individual RGB LEDs are active at any moment in time.

However, there are numerous drawbacks with this RGB LED approach to implementing large display panels. One significant problem is that it is quite difficult to make the red and green LEDs on the panel all individually generate the exact same visual color appearance. If some of the red and green LEDs produce different shades of red or green color from other red and green LEDs, then this inconsistency in the color performance of the LEDs causes the overall panel to produce unacceptable images. This color inconsistency may be due to numerous reasons, such as differential thermal performance, and differences in required drive voltages and current of the different LEDs. Even if the panel produces consistent colors early in its usage period, it is likely that differential aging effects will cause color inconsistencies to appear later in its usage life.

Another problem with the large displays made with individual RGB LEDs is that the red, green, and blue LEDs on the panel are prominently visible as separate LED lights, especially when a viewer is located near to the panel. This causes the RGB panels to have an aesthetically unpleasing visual appearance to many viewers of the panel.

The present invention provides an approach to implement large format displays that at least in part overcomes the limitations of the known devices.

SUMMARY

The present disclosure describes an improved approach to implement a solid-state-based large area (format) color display and lighting panel which does not use an array of RGB LEDs, but instead uses an array of single color solid-state lighting elements (e.g., LEDs). In some embodiments, the panel comprises an array of blue LEDs, where each pixel of the array comprises three blue LEDs. An overlay is placed over the array of blue LEDs, where the overlay comprises a printed array of phosphor portions. Each pixel on the PCB comprises three blue LEDs that is matched to a corresponding portion of the overlay having the printed phosphor portions.

The printed phosphor portions of the overlay includes a number of regions of blue light excitable phosphor materials that are configured to convert, by a process of photoluminescence, blue excitation light generated by the light sources into green or red and colored light. Regions of the overlay associated with generating blue light comprise an aperture/window that allows blue light to pass through the overlay. Regions associated with generating blue light will typically not include a phosphor material.

This approach provides numerous advantages over the approach of using RGB LEDs. Firstly, since all the LEDs used in the array are the same type of blue LEDs, the invention eliminates color drifts due to differential thermal performance and differential aging. In addition, a common drive voltage and current can be employed in a set of simpler "monochrome" drive electronics to drive all of the LEDs in the array. This provides a far superior approach over the RGB LED panels that are significantly more difficult to manufacture and calibrate to achieve consistent color outputs. Even if multiple panels are placed together to form larger displays, the present invention allows this type of configuration to be achieved without creating color inconsistencies between the panels.

From an aesthetics point of view, the overlay provides a perfectly flush surface that is pleasing to the eye, even in an off-state. This eliminates any unpleasant appearances associated with the use of individually visible red, green, and blue LEDs in the prior approaches. The overlay can be formed to have any surface texture or appearance. For example, the exterior of the overlay can be formed to present a high gloss finish.

In operation, the generated light is substantially or perfectly Lambertian in nature, creating images that overcomes the point LED effects of the prior RGB LED approaches.

BRIEF DESCRIPTION OF THE DRAWINGS

In order that the present invention is better understood large format displays and lighting panels in accordance with embodiments of the invention are described, by way of example only, with reference to the accompanying drawings in which.

DETAILED DESCRIPTION OF THE INVENTION

Figure 1:
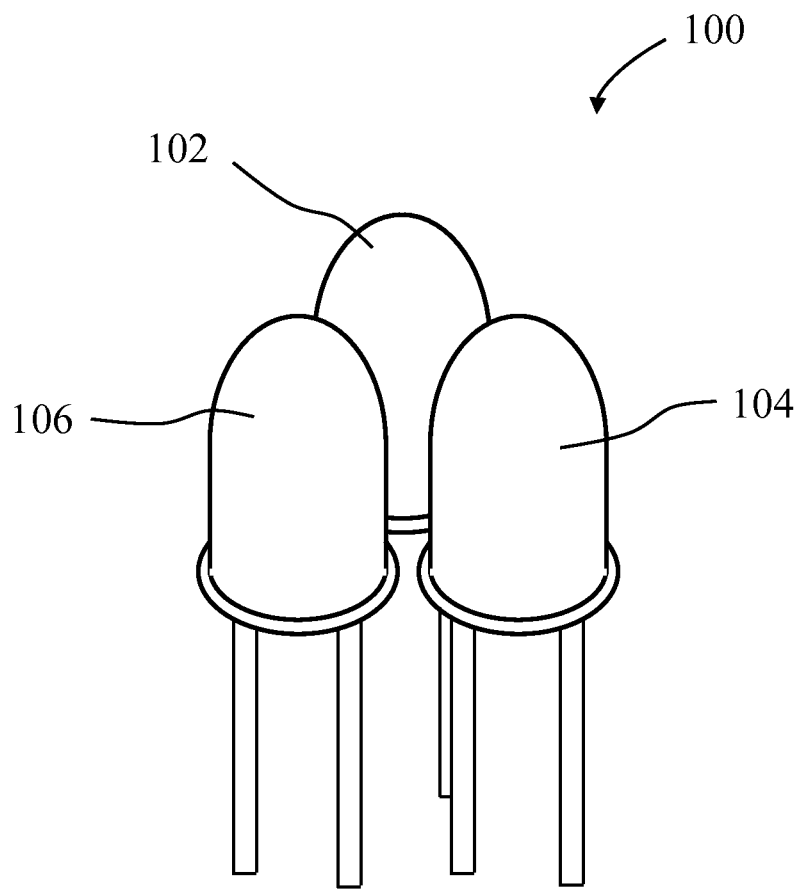
FIG. 1 illustrates RGB LEDs as previously described.

Throughout this patent specification, like reference numerals are used to denote like parts. For the purposes of illustration only, the following description is made with reference to photoluminescence material embodied specifically as phosphor materials. However, the invention is applicable to any type of photoluminescence material, such as phosphor materials and quantum dots. A quantum dot is a portion of matter (e.g. semiconductor) whose excitons are confined in all three spatial dimensions that may be excited by radiation energy to emit light of a particular wavelength or range of wavelengths. As such, the invention is not limited to phosphor based wavelength conversion materials unless claimed as such.

Embodiments of the present invention concerns solid-state-based large area color displays. In the context of this patent specification a large area display or lighting panel typically has a width or height of several feet, e.g. at least four feet, and more typically at least ten to fifteen feet. Due to the modular nature of the invention a display panel of virtually any size can be fabricated such as display panels that are several tens of feet in size.

Figure 2A:
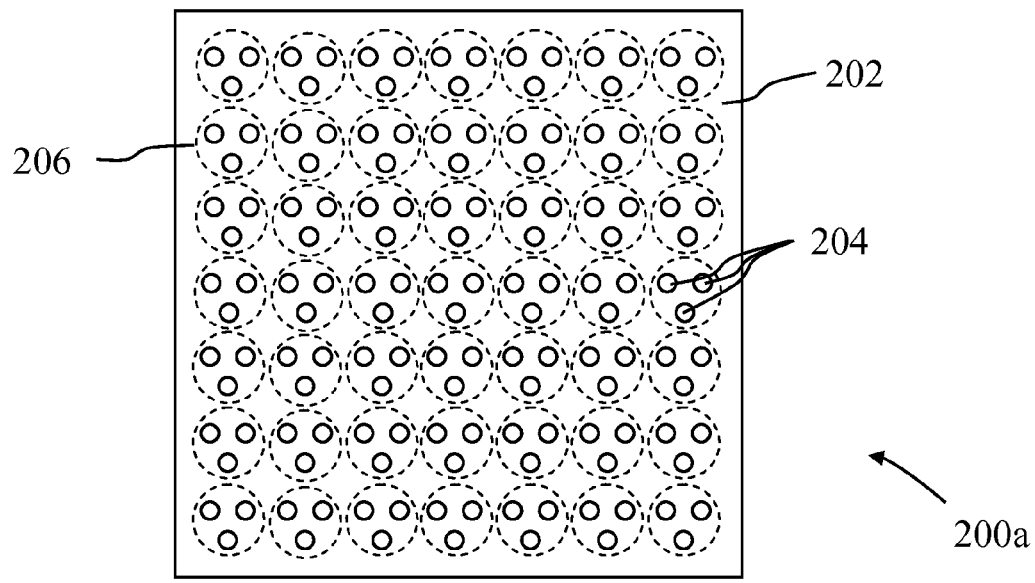
FIGS. 2A and 2B respectively illustrate an array of blue LEDs and a phosphor overlay in accordance with an embodiment of the invention.
Figure 2B:
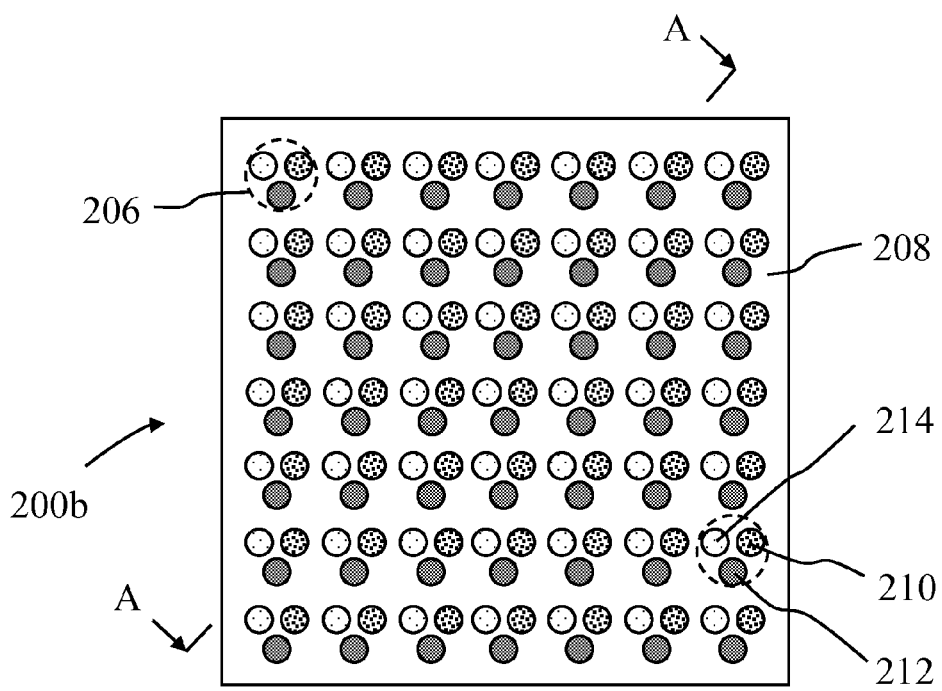

The present disclosure describes an improved approach to implement an LED-based large area display which does not use an array of RGB LEDs, but instead uses an array of single color solid-state lighting elements (e.g. LEDs). In a preferred embodiment as shown in FIGS. 2A and 2B, the panel 200 comprises an array 200a of blue LEDs and an overlay 200b, where each pixel 206 of the array 200a comprises three blue LEDs 204. The array 200a of blue LEDs may be manufactured using one or more printed circuit boards (PCBs) 202 with the LEDs 204 arranged in any desired array pattern on the PCB(s) 202. The solid-state light sources on the PCB 202 preferably comprise LEDs 204 that are operable to generate blue light with a peak wavelength of order 455 nm. An example of a suitable source would be a GaN-based (gallium nitride) LEDs. Alternatively the light source can comprise one or more laser diodes or other solid-state light emitters.

An overlay 200b is placed over the array of blue LEDs 200a to implement the inventive large area display, where the overlay 200b comprises a printed array of phosphor portions (e.g., portions 210 and 212) on a light transmissive substrate 208. Each pixel 206 on the PCB 202 comprised of three blue LEDs 204 is matched to a corresponding portion of the overlay 200b having the printed phosphor portions. The printed phosphor portions of the overlay includes a number of regions of blue light excitable phosphor materials that are configured to, by a process of photoluminescence, convert blue excitation light generated by the light sources 204 into green (G) or red (R) colored light. The printed phosphor portions may include a red phosphor portion 210 to generate red light and a green phosphor portion 212 to generate green light. Regions of the overlay associated with generating blue light comprise an aperture/window 214 that allows blue light to pass through the overlay. Regions associated with generating blue light will typically not include a phosphor material.

For ease of fabrication the display panel is composed of a number of display tiles such as those shown in FIGS. 2A and 2B. For example in one embodiment each PCB and overlay comprises a twelve inch square.

Figure 3:
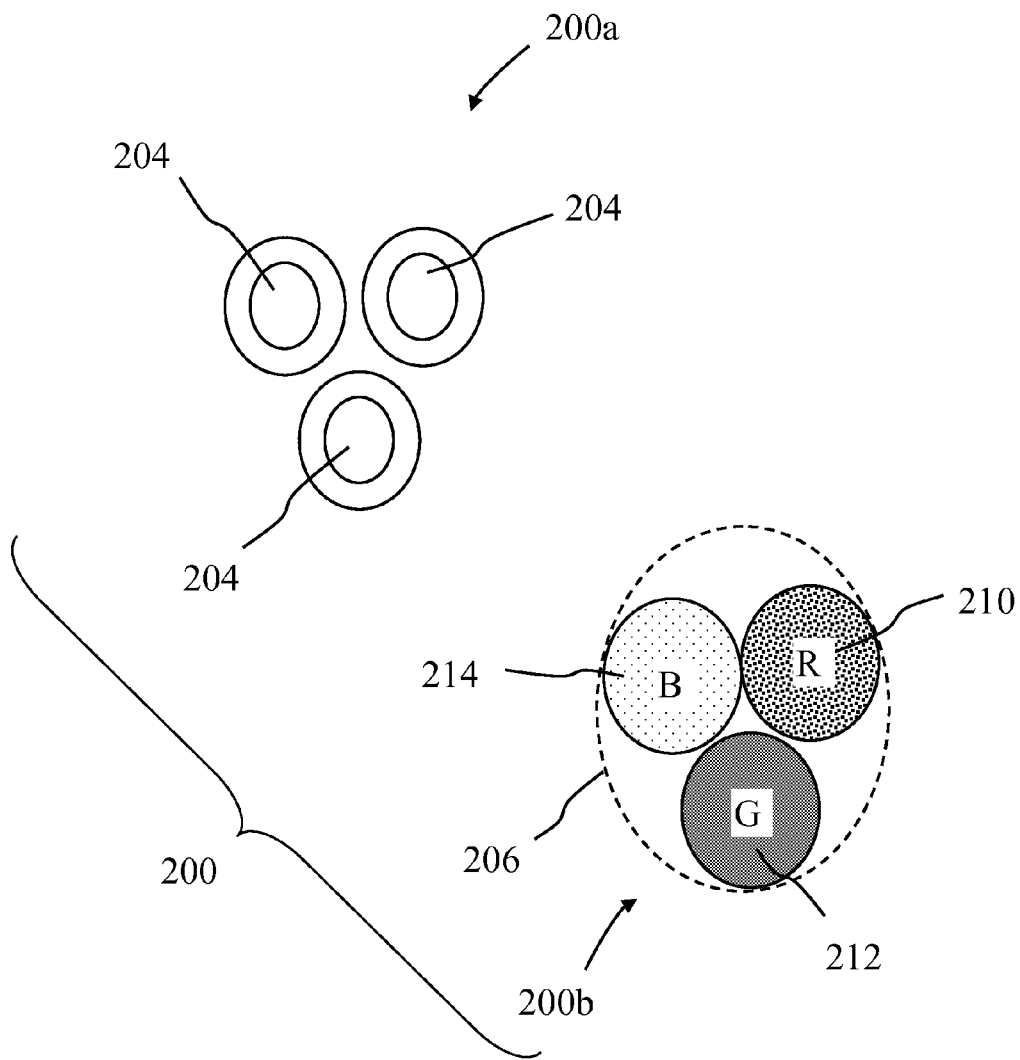
FIG. 3 illustrates a configuration of printed phosphor portions on an overlay.

As shown in more detail in FIG. 3, the printed phosphor portions of the overlay 200b include a red phosphor portion 210 that mates to one of the three blue LEDs 204 to generate red light, a green phosphor portion 212 that mates to a second one of the three blue LEDs 204 to generate green light, and a light-transmissive aperture/window 214 to allow transmission of blue light from the third of the three blue LEDs. This approach permits an array of pixels on a large display, with each pixel having red, green, and blue color sub-pixels (elements), to be manufactured using an array of only blue LEDs. In some embodiments, the light-transmissive aperture/window 214 comprises a diffuser material to diffuse blue light from the LED 204. Alternatively, the light-transmissive aperture/window 214 can be configured to not include a diffuser material.

In operation, blue light is generated by the blue LEDs 204 which project towards the overlay 200b containing the regions of phosphor materials and apertures/windows. Each pixel 206 on the panel 200 is controllable by controlling the operation of the three blue LEDs 204 for that pixel 206. During the time intervals that a pixel 206 on the panel is active, one or more of the blue LEDs 204 for that pixel 206 is emitting blue light. Depending upon the color that is sought for that pixel, the appropriate blue LED(s) 204 for that pixel 206 are activated to generate blue light, which may be absorbed by the red and/or green phosphor materials and re-emitted as light of a different color (e.g. wavelength for red and/or green light), or which pass through the aperture as blue light. The combination of the emitted light for each grouping of the red phosphor portion (sub-pixel) 210, green phosphor portion (sub-pixel) 212, and blue aperture portion (sub-pixel) 214 generates the light pertaining to a single pixel 206 on the panel. An image is formed by coordinating the display of multiple relevant pixels (in appropriate colors) for the entire panel.

This approach provides numerous advantages over the approach of using RGB LEDs. Since all the LEDs used in the array are the same type of blue LEDs, the invention eliminates color drifts due to differential thermal performance and differential aging of the LEDs. In addition, a common drive voltage and current can be employed in a set of simpler "monochrome" drive electronics to drive all of the LEDs in the array. This provides a far superior approach over the RGB LED panels that are significantly more difficult to manufacture and calibrate to achieve consistent color outputs. Even if multiple tiles are placed together to form larger display panels, the present invention allows this type of configuration to be achieved without creating color inconsistencies between the tiles.

From an aesthetics point of view, the overlay provides a perfectly flush surface that is pleasing to the eye, even in an off-state. This eliminates any unpleasant appearances associated with the use of individually visible red, green, and blue LEDs in the prior approaches. The overlay can be formed to have any surface texture or appearance. For example, the exterior of the overlay can be formed to present a high gloss finish. Typically the overlay can cover multiple LED arrays.

In operation, the generated light is substantially or perfectly lambertian in nature, creating images that overcomes the point LED effects of the prior RGB LED approaches.

As described, the overlay comprises one or more printed phosphor portions of different blue light excitable phosphor materials, e.g. green, red, and/or yellow, which are operable to respectively generate green, red and yellow light. In one arrangement the region of green phosphor material comprises an aluminate-based phosphor material that is operable to generate green light with a peak wavelength $\lambda_p$ in a range 520 nm to 548 nm. The region of red phosphor material can comprise a nitride phosphor that is operable to generate red light with a peak wavelength $\lambda_p$ in a range 608 nm to 635 nm whilst regions of yellow phosphor material, when present, can comprise a YAG-based (yttrium aluminum garnet) phosphor material that is operable to generate light with a peak wavelength $\lambda_p$ in a range 560 nm to 573 nm. Examples of suitable phosphor materials from Internatix Corporation of Fremont, Calif. are given in TABLE 1.

TABLE 1

Selected Internatix Corporation phosphor materials

| Emission Color | Product | Composition | 1931 CIE (x, y) | Peak wavelength $\lambda_p$ (nm) |
|---|---|---|---|---|
| Green | GAL530 | Aluminate | 0.347, 0.573 | 530 |
| Green | GAL545 | Aluminate | 0.395, 0.555 | 545 |
| Red | R6436 | Nitride | 0.634, 0.366 | 630 |
| Red | R6535 | Nitride | 0.643, 0.356 | 640 |
| Red | R6634 | Nitride | 0.654, 0.356 | 650 |
| Red | R6733 | Nitride | 0.672, 0.327 | 655 |
| Red | R6832 | Nitride | 0.682, 0.317 | 660 |
| Red | R6931 | Nitride | 0.694, 0.305 | 670 |
| Yellow | NYAG4156 | Ce doped YAG | 0.406, 0.557 | 545 |
| Yellow | NYAG4355 | Ce doped YAG | 0.426, 0.548 | 551 |
| Yellow | NYAG4454 | Ce doped YAG | 0.444, 0.536 | 558 |
| Yellow | NYAG4653 | Ce doped YAG | 0.458, 0.526 | 562 |

It will be appreciated that the regions of phosphor material can comprise a mixture of two or more phosphor materials.

While the disclosure refers to the phosphor regions as "printed" phosphor portions, it is noted that any suitable approach can be taken to apply phosphor material to the overlay. Therefore, the invention is not to be limited to an overlay in which phosphor is applied using a printing approach. However, in preferred embodiments the regions of phosphor material are screen printed on the overlay using a photoluminescence composition comprising a slurry of the powdered phosphor material(s) and a light transmissive curable liquid binder material. Since the photoluminescence composition is printable it will, for the sake of brevity, be referred to as "phosphor ink". Typically the regions of phosphor materials are printed so that there is no overlap of neighboring regions and the regions are preferably printed such that neighboring regions abut one another. The phosphor ink binder can comprise a curable liquid polymer such as a polymer resin, a monomer resin, an acrylic-poly(methyl methacrylate) (PMMA), an epoxy (polyepoxide), a silicone or a fluorinated polymer. It is important that the binder material is, in its cured state, transmissive to all wavelengths of light generated by the phosphor material(s) and the solid-state light source and preferably has a transmittance of at least 0.9 over the visible spectrum (380 nm to 800 nm). The binder material is preferably U.V. curable though it can be thermally curable, solvent based or a combination thereof. U.V. or thermally curable binders can be preferable because, unlike solvent-based materials, they do not "outgas" during polymerization. When a solvent evaporates the volume and viscosity of the phosphor ink will change resulting in a higher concentration of phosphor material which can affect the emission color of light generated by the region. With U.V. curable polymers, the viscosity and solids ratios are more stable during the deposition process with U.V. curing used to polymerize and solidify the layer after deposition is completed. Moreover, since in the case of screen printing of the phosphor ink multiple-pass printing may be required to achieve a required layer thickness, the use of a U.V. curable binder is preferred since each layer can be cured virtually immediately after printing prior to printing of the next layer.

The color of light generated by each phosphor material region will depend on the phosphor material composition whilst the amount of photoluminescence light will depend on the quantity of phosphor material per unit area. It will be appreciated that the quantity of phosphor material per unit area is dependent on both the thickness of the phosphor ink layer and the weight loading of phosphor material to binder. Some parameters that may affect the overlay's optical and thermal performance are the quantity of phosphor material per unit area and the thickness of the phosphor material regions. For example, if the thickness of the phosphor material region is increased above a certain thickness, the optical efficiency of the region may decrease due to the absorption of photoluminescence light by the phosphor material layer. Conversely, if the thickness of the phosphor ink layer is too thin, the optical efficiency may also decrease since only a small proportion of the excitation light will be converted to photoluminescence light.

The quantity of phosphor material per unit area for each region can be controlled by varying the screen size and/or number of print passes used to deposit the region. Alternatively, the weight of phosphor material per unit area can be altered by varying the weight loading of phosphor material to binder. To enable printing of the phosphor material regions in a minimum number of print passes, the phosphor ink preferably has as high a solids loading of phosphor material to binder material as possible/optimal and preferably has a weight loading in a range 40% to 75%. A high phosphor material weight loading is further advantageous in maximizing the conduction of heat from the phosphor material by minimizing the total quantity of binder which as described is typically a poor thermal conductor.

The viscosity of the phosphor ink is determined by the viscosity of the binder material and weight loading of phosphor material. The binder material preferably has a viscosity in a range 1 Pa·s to 2.5 Pa·S (1000 to 2500 cps). For screen printing the binder material preferably has a viscosity in a range 0.1 to 5 Pa·s (100 to 5000 cps) and preferably about 1 Pa·s to 2.5 Pa·S (1000 to 2500 cps). Thinning additives can be used during initial formulation of the phosphor ink to achieve a required viscosity and to "thin" the phosphor ink during printing. However care must be exercised when thinning to maintain the solids loading since it is the phosphor material content (loading) and layer thickness, not viscosity, that affects the color of light generated by the phosphor ink.

As well as viscosity, the surface tension of the binder material can affect the phosphor ink's performance. For example if the surface tension of the phosphor ink is too high, bubbles can form during printing resulting in poor layer formation. Bubbles can also form in phosphor inks with a low surface tension and it is preferred to additionally add a defoaming agent to the phosphor ink. Whilst it is preferred to screen print the phosphor ink, other deposition methods and printing techniques can be used to deposit the regions of phosphor material.

The phosphor material can comprise an inorganic or organic phosphor, such as for example. silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 B2 "Silicate-based green phosphors" (assigned to Internatix Corp.), U.S. Pat. No. 7,601,276 B2 "Two phase silicate-based yellow phosphors" (assigned to Internatix Corp.), U.S. Pat. No. 7,655,156 B2 "Silicate-based orange phosphors" (assigned to Internatix Corp.) and U.S. Pat. No. 7,311,858 B2 "Silicate-based yellow-green phosphors" (assigned to Internatix Corp.). The phosphor can also comprise an aluminate-based material such as is taught in patent application US2006/0158090 A1 "Novel aluminate-based green phosphors" and U.S. Pat. No. 7,390,437 B2 "Aluminate-based blue phosphors" (assigned to Internatix Corp.), an aluminum-silicate phosphor as taught in application US2008/0111472 A1 "Aluminum-silicate orange-red phosphor" or a nitride-based red phosphor material such as is taught in United States patent application US2009/0283721 A1 "Nitride-based red phosphors" and US2010/0308712 A1 "Nitride-based red-emitting in RGB red-green-blue lighting systems". It will be appreciated that the phosphor material is not limited to the examples described and can comprise any phosphor material including nitride and/or sulfate phosphor materials, oxy-nitrides and oxy-sulfate phosphors, Garnet structured phosphor materials or YAG materials.

It will be appreciated that the invention is not limited to the exemplary embodiments described and that variations can be made within the scope of the invention. For example, at a blue light generating portion of the overlay, particles of a light scattering (e.g. diffuser) material can be provided to ensure that the emission of light from such portion more closely resembles the emission pattern of light from portions containing a phosphor material. In one arrangement the light scattering material comprises particles of titanium dioxide ($TiO_2$) though it can comprise barium sulfate ($BaSO_4$), magnesium oxide (MgO), silicon dioxide ($SiO_2$) or aluminum oxide ($Al_2O_3$). So that the portions of the overlay corresponding to the generation of blue light scatter light in a way that closely resembles portions containing a phosphor material, the light scattering material is preferably mixed with a light transmissive binder and applied to the overlay using the same method, preferably screen printing, to apply the phosphor materials.

A diffuse pattern may be provided on the exterior surface of the overlay to improve the appearance of the display panel. For example, a black diffuse pattern may be provided on the exterior surface of the overlay.

Figure 4:
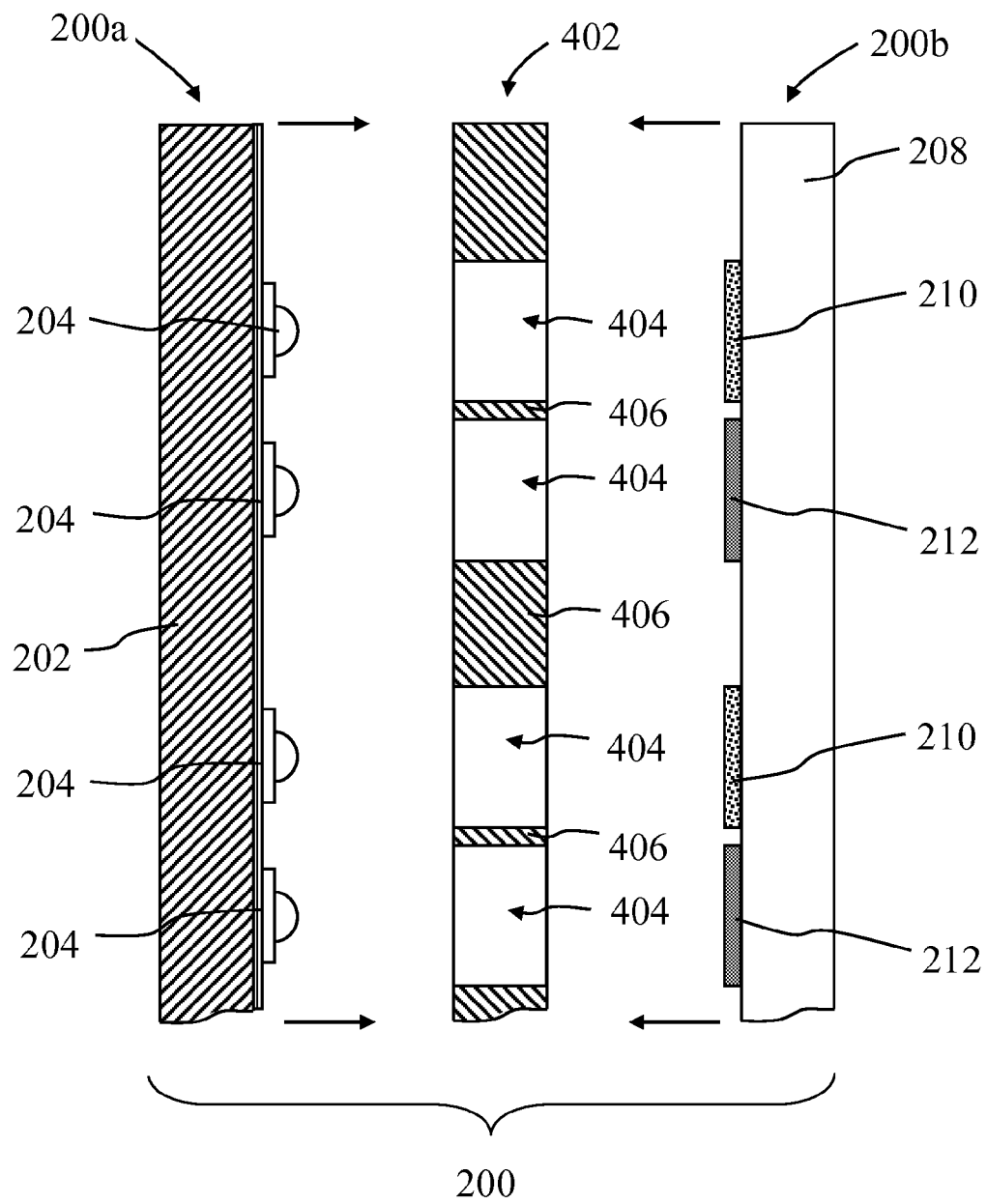
FIG. 4 is an exploded schematic sectional view showing the layers within a panel according to some embodiments.

FIG. 4 illustrates the different tiers of a structure to implement some embodiments of the invention. This figure shows a sandwich structure having a PCB 202 with the LEDs 204 which is separated from the overlay 200b using a spacer component 402. For each pixel, the spacer component 402 includes through apertures 404 corresponding to each of the sub-pixels and walls 406 between each of the different color portions (sub-pixels) of that pixel. The reason for this structure is because the phosphor generated light is emitted isotropically in all directions. Therefore, the walls are included to prevent visible emissions of isotropically generated photoluminescent light in unintended directions and/or to physically limit the size of the phosphor spot in a radial direction. The interior surfaces of the walls are preferably formed to include reflective material.

The phosphor portions 210 and 212 of the overlay 200b may be implemented using any suitable process. As described above, the phosphor material may be printed onto the overlay 200b, e.g., on an interior surface of the overlay 200b as shown in FIG. 4. This approach allows the overlay 200b to provide protection to the sensitive phosphor materials from exterior environmental forces and/or contaminants. Alternatively, the phosphor portions can be integrally formed within appropriate portions of the overlay 200b or applied to the exterior surface of the overlay.

Figure 5A:
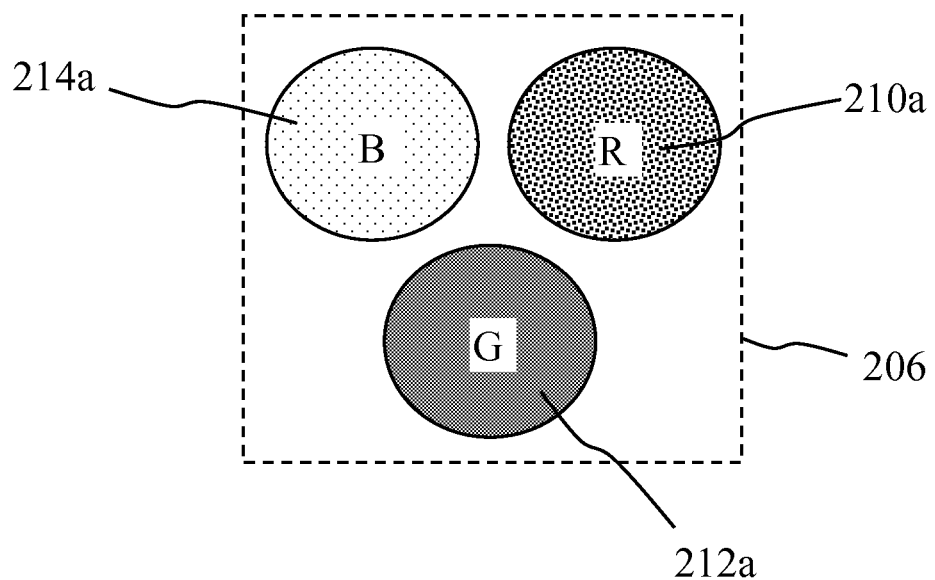
FIGS. 5A-5E illustrate various layouts for the pixels.

The phosphor portions on the overlay may be formed into any suitable configuration. FIG. 5A illustrates an approach in which each pixel 206 comprises phosphor portions (sub-pixels) that are all of equal size with similar circular shapes. Here, the aperture/window 214a has the same size as the red phosphor portion 210a and green phosphor portion 212a.

Figure 5B:
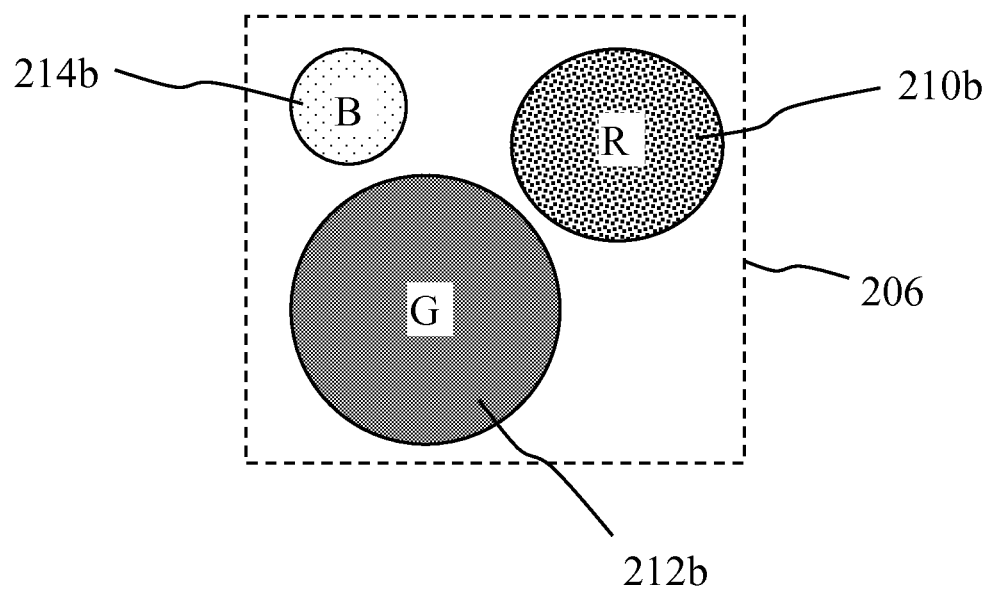

FIG. 5B illustrates an approach where the pixel comprises sub-pixels that can be of different dimensions and/or sizes. For example to take account of the photopic response of the eye, the green phosphor sub-pixel 212b can be printed with the largest size, followed by the size of the red phosphor sub-pixel 210b, with the aperture for the blue sub-pixel 214b having the smallest size. The size of each pixel is typically between 5 and 25 mm depending on the size and resolution of the display. For example a fifteen foot wide medium definition display panel in some embodiments can be implemented with pixels that are approximately 5 mm.

Figure 5C:
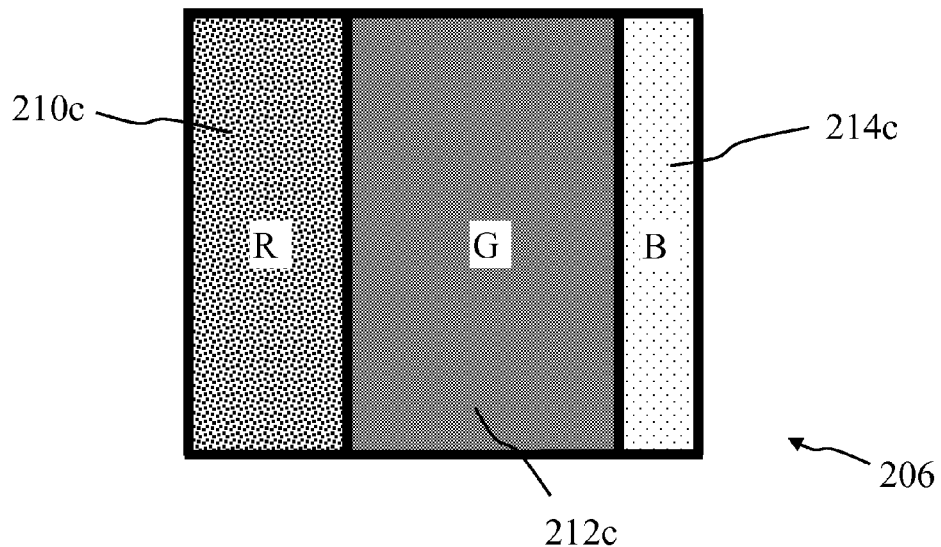

FIG. 5C illustrates an approach in which the phosphor sub-pixels are printed as rectangular shapes instead of circular shapes. Each pixel 206 comprises rectangular-printed sub-pixels, including red sub-pixel 210c and green sub-pixel 212c. The blue sub-pixel comprises a rectangular aperture/window 214c. As previously discussed, the aperture/window 214c may include a diffuser in some embodiments.

The rectangular-printed sub-pixels can be formed to have different sizes and/or dimensions. For example, the green phosphor sub-pixel 212c can be printed with the largest rectangular size, followed by the size of the rectangular red phosphor sub-pixel 210c, with the rectangular aperture for the blue sub-pixel 214c having the smallest size.

Figure 5D:
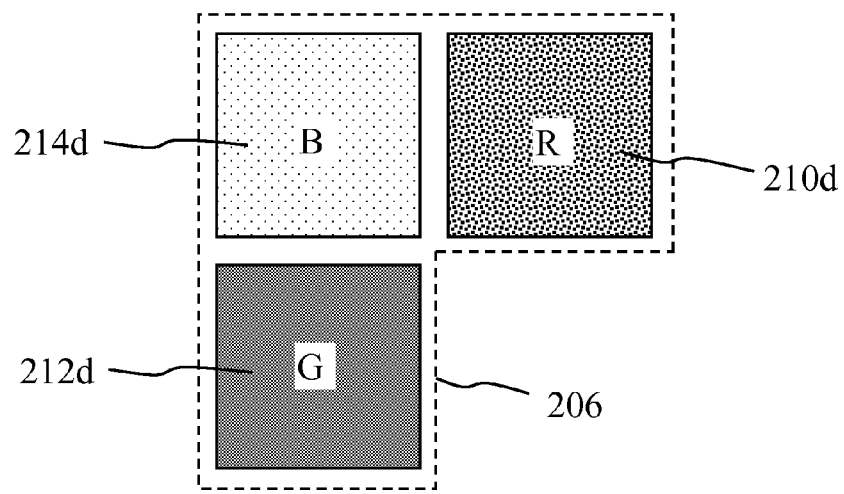
Figure 5E:
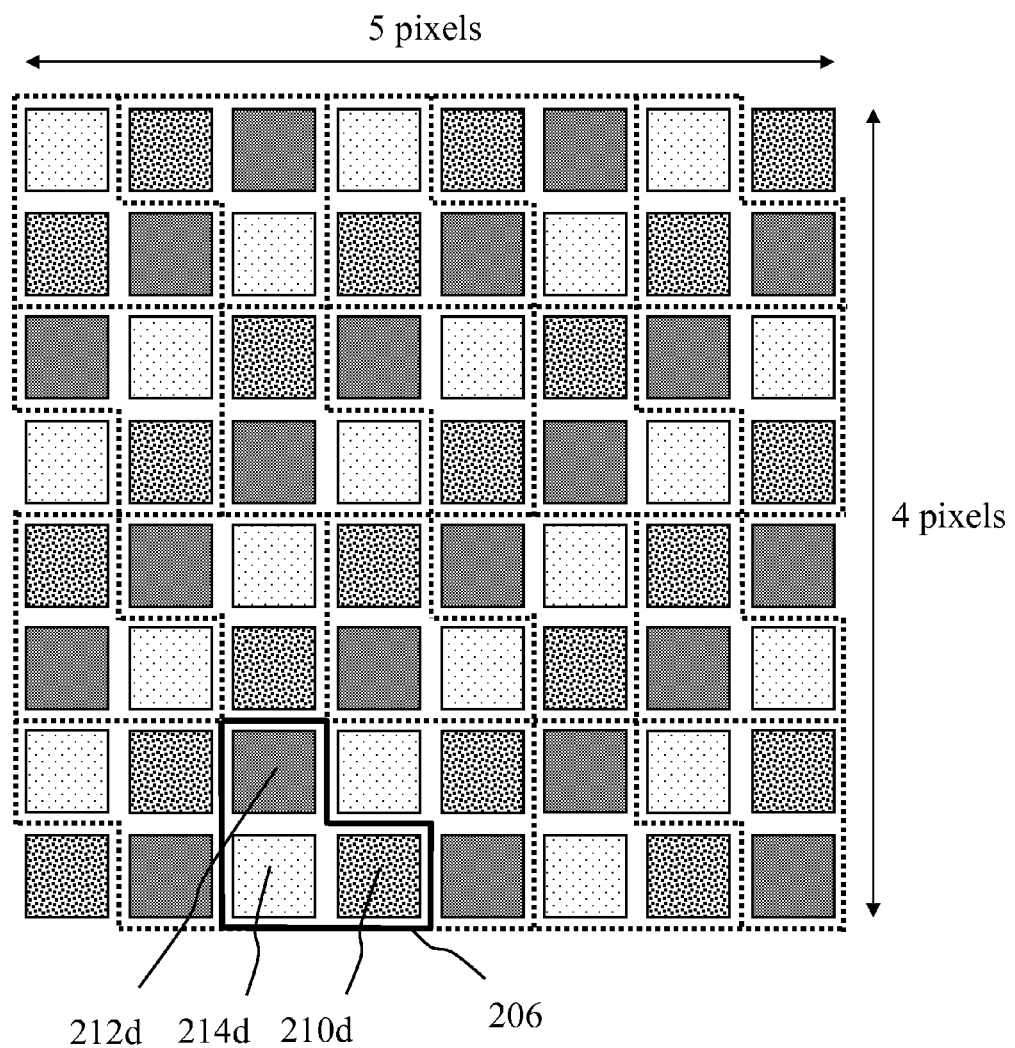

In some embodiments, the pixels 206 can be implemented with a pixel configuration which is shaped to fit within a variable interlocking format. The shape of the pixels 206 can be configured to match any suitable interlocking format. For example, consider the interlocking format shown in FIGS. 5D and 5E. Here, each pixel 206 is configured to have an "L" shape, and interlocking occurs by matching each L-shaped pixel with another inverted L-shaped pixel. By interlocking the pixels in this manner, each pair of interlocked pixels combine to forms a rectangular shape. The pixels on the panel in FIG. 5E are therefore populated with an array of such interlocked L-shaped pixel combinations.

The individual sub-pixel elements can be shaped to fit within the footprint of the interlocked pixels. Here, the L-shaped pixel 206 may be configured to include rectangular sub-pixel shapes, where the rectangular-shaped green sub-pixel element 212d is located at one end of the pixel 206, the rectangular-shaped red sub-pixel element 210d is located at the other end of the pixel 206, and the rectangular-shaped blue sub-pixel aperture/window 214d is located at the "elbow" region in the middle.

The number of pixels in the panel can be adjusted to change the resolution of the display. As is evident, increasing the number of pixels will increase the display resolution while decreasing the number of pixels will decrease the display resolution. Decreasing the resolution may provide certain advantages in certain applications. For example, manufacturing a larger display with lower resolution may be more cost effective for consumers and customers that do not wish to pay for more expensive devices, particularly if the higher resolution is not needed. For instance, some customers may seek to implement an "ambiance" or "mood" wall, where softer images are desired and higher resolutions are not needed. Such a device can be termed a large format lighting panel.

Figure 6:
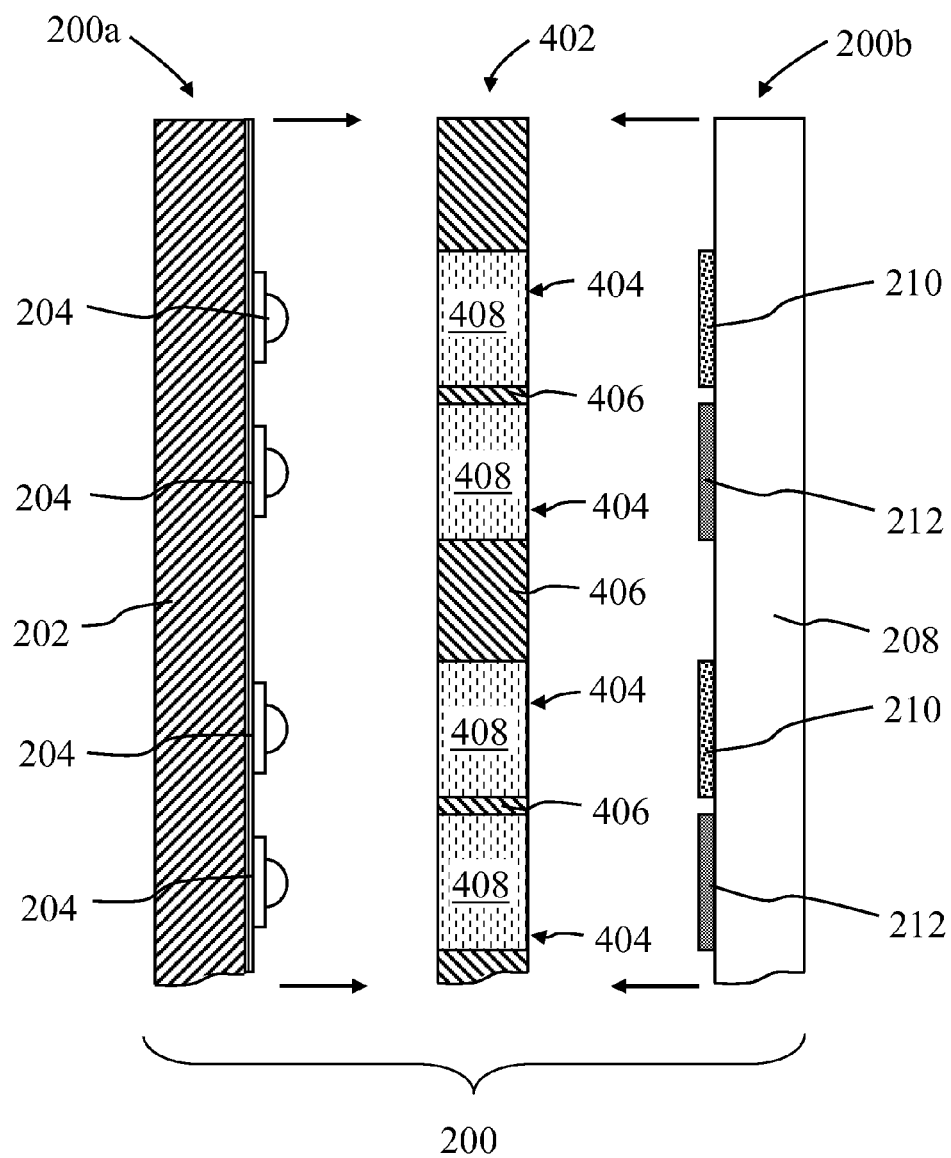
FIG. 6 is an exploded schematic sectional view showing the layers within a panel according to some embodiments.

In some embodiments, further operating efficiencies for the display panel are provided by including an optical medium. As illustrated in FIG. 6, the optical medium 408 may be provided within the apertures 404 of the spacer component 402 to fill the space surrounding the LEDs. The optical medium 408 comprises a material possessing an index of refraction that more closely matches the index of refraction for the LEDs, any type of encapsulating material that may exist on top of the LEDs, and/or the portions of the overlay that come into contact with the optical medium, e.g., the phosphor regions of the overlay and/or the aperture/window region.

One reason for using the optical medium 408 is to eliminate air interfaces that exist between the LEDs and the overlay. The problem addressed by this embodiment is that a mismatch may exist between the index of refraction of the material of the phosphor on the overlay and the index of refraction of the air within the interior volumes (cavities) 404 of the spacer. This mismatch in the indices of refraction for the interfaces between air and the overlay components may cause a significant portion of the light to be lost in the form of heat generation. As a result, lesser amounts of light and excessive amounts of heat are generated for a given quantity of input power.

By filling the surrounding volume 404 around the LEDs in the spacer 402 with an optical medium, this approach permits light to be emitted to, within, and/or through the interior volumes without having to incur losses caused by excessive mismatches in the indices of refraction for an air interface. The optical medium 408 may be selected of a material, e.g. silicone, to generally fall within or match the index of refraction for materials typically used for the overlay material (e.g., phosphor), the LEDs, and/or any encapsulating material that be used to surround the LEDs. Further details regarding an exemplary approach to implement the optical medium are described in U.S. Provisional Application Ser. No. 61/657,702, filed on Jun. 8, 2012, entitled "Solid-State Lamps with Improved Emission Efficiency and Photoluminescence Wavelength Conversion Components Therefor" and U.S. application Ser. No. 13/769,210, filed Feb. 15, 2013, entitled "Solid-State Lamps with Improved Emission Efficiency and Photoluminescence Wavelength Conversion Components Therefor", which are hereby incorporated by reference in their entireties.

Figure 7A:
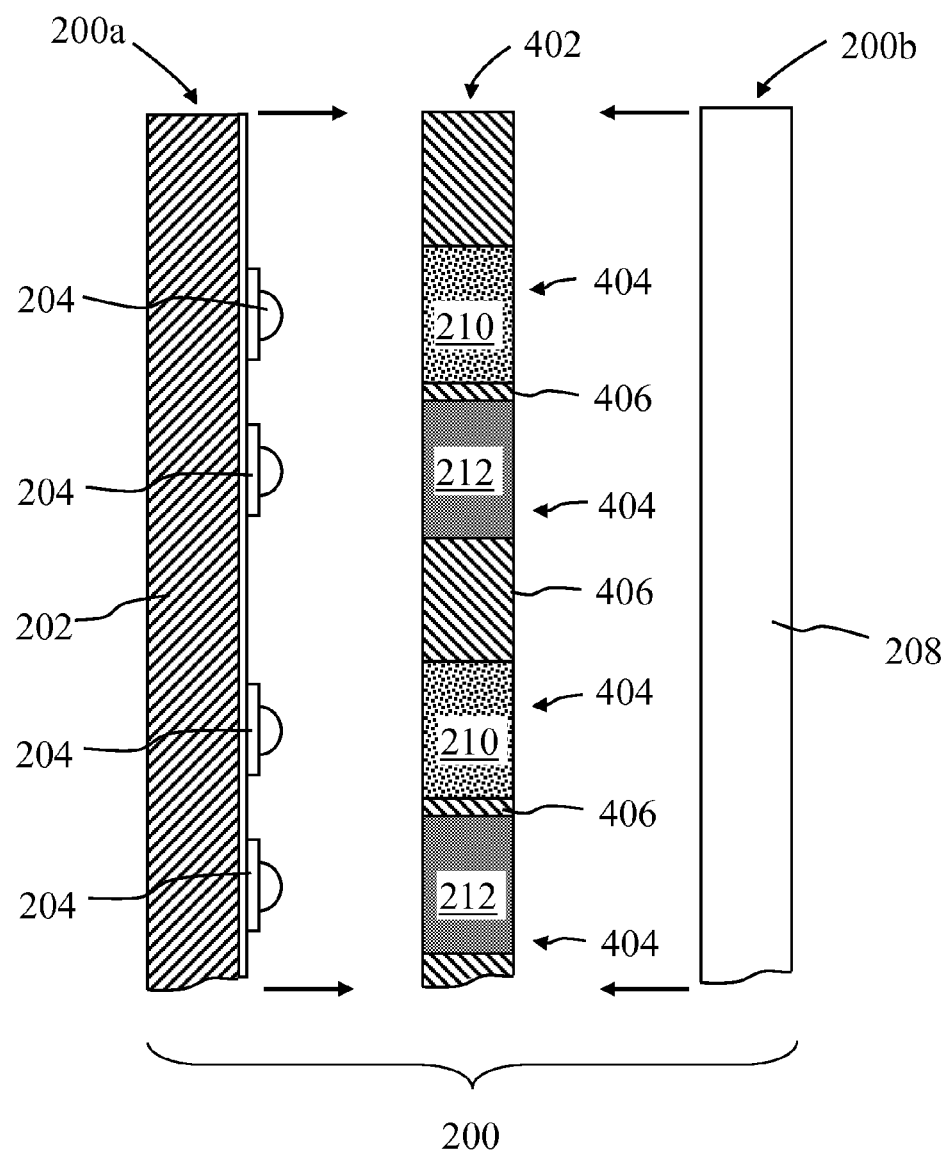
FIGS. 7A-7B illustrate exploded schematic sectional views showing the layers within a panel according to some embodiments.
Figure 7B:
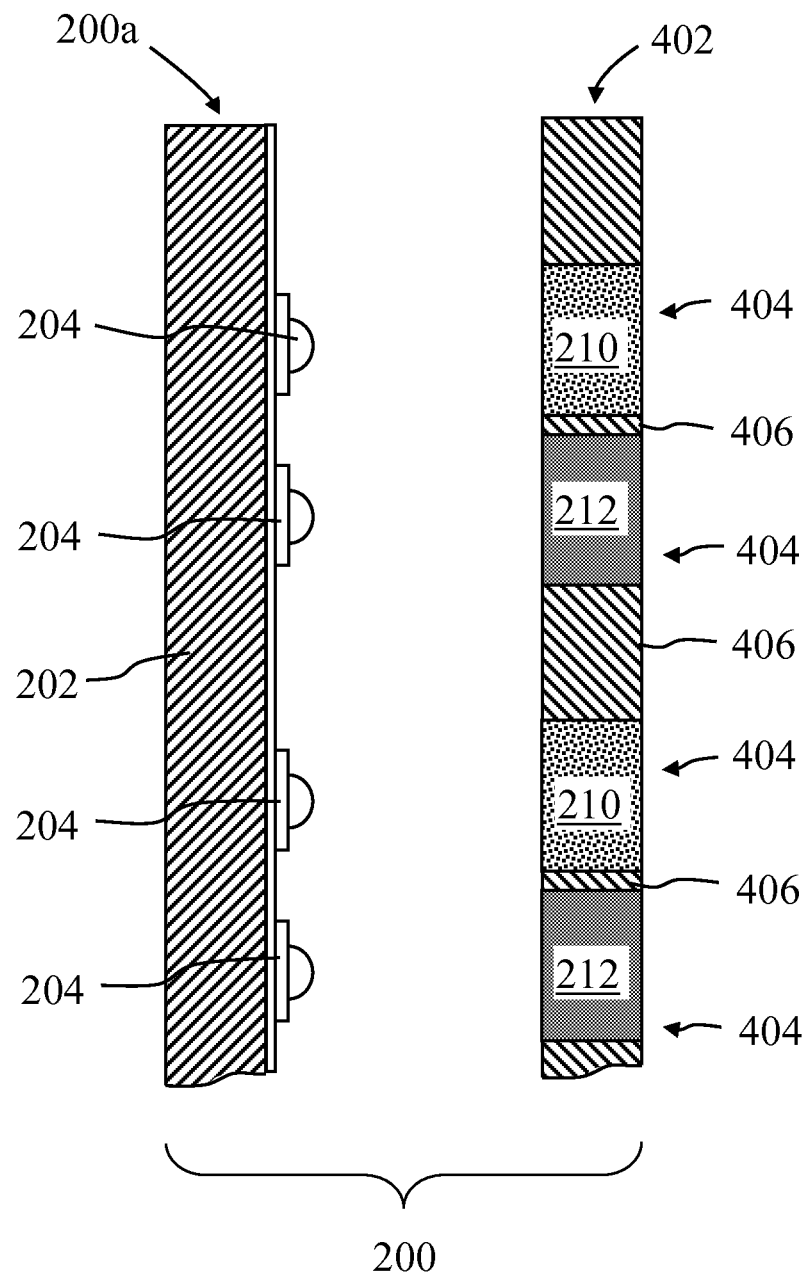

In some embodiments, as shown in FIGS. 7A and 7B, the cavities 404 within the spacer component 402 can be filled with a colored silicon/phosphor composition. In this approach, green phosphor materials and red phosphor materials are placed into the portions of the spacer that correspond to the green sub-pixel 212 and red sub-pixel 210, respectively. The blue sub-pixel regions would include non-colored transparent optical fill material in the corresponding spacer portions. This approach would therefore eliminate the need to print green and red phosphor regions on a separate overlay, potentially providing enhanced light extraction in certain circumstances.

The approach of FIG. 7A includes an overlay 200b. The overlay 200b can be used to provide protection to the phosphor materials from external environmental conditions and/or contaminants that may otherwise damage or reduce the effectiveness/efficiency of the phosphor materials. The overlay 200b may also serve to provide a more aesthetically pleasing product, e.g., where the exterior of the overlay 200b provides a glossy exterior surface that is pleasing to the eye. In the alternative embodiments, the panel 200 does not include an overlay, e.g., as shown in FIG. 7B.

While various embodiments of the larger format display have been described above, the invention is not limited solely to these applications and can be used in other lighting applications and embodiments as well.

It will be appreciated that the present invention is not limited to the specific exemplary embodiments described and that variation can be made within the scope of the invention. For example the shape and layout of pixel and sub-pixels can be varied and in some embodiments it is envisioned that each pixel can comprise further different colored sub-pixels such as for example yellow.

What is claimed:

1. A display panel comprising:
an array of light emitting pixels comprising red, blue and green light emitting sub-pixels;
a pixel in the array of light emitting pixels comprising an array of three blue light emitting solid-state devices and a light transmissive overlay placed over the array of solid-state light emitters; and
wherein regions of the overlay corresponding to red light emitting sub-pixels comprise a red light emitting photoluminescence material, regions of the overlay corresponding to green light emitting sub-pixels comprise a green light emitting photoluminescence material and regions of the overlay corresponding to blue light emitting sub-pixels comprise a light transmissive region.

2. The display panel of claim 1, wherein the solid-state light emitters comprise light emitting diodes.

3. The display panel of claim 1, wherein the photoluminescence materials are selected from the group consisting of a phosphor material, quantum dots, and combinations thereof.

4. The display panel of claim 1, wherein the display panel comprises a large area display having a width or height of at least 4 feet.

5. The display panel of claim 1, further comprising a spacer located between the array of the three blue light emitting solid-state devices and the light transmissive overlay.

6. The display panel of claim 5, wherein the spacer implements a wall between light emitting devices for adjacent sub-pixels.

7. The display panel of claim 5, further comprising an optical medium within the spacer.

8. The display panel of claim 1, further comprising a common drive voltage or current to drive the array of the three blue light emitting solid-state devices.

9. The display panel of claim 1, wherein the light transmissive overlay comprises a gloss finish.

10. The display panel of claim 1, wherein the photoluminescence material is printed onto the overlay.

11. The display panel of claim 1, wherein the overlap comprises a diffuser material.

12. The display panel of claim 11, in which the diffuser material is located at the regions of the overlay corresponding to blue light.

13. The display panel of claim 11, wherein the diffuser material is selected from the group consisting of titanium dioxide ($TiO_2$), barium sulfate ($BaSO_4$), and magnesium oxide (MgO), silicon dioxide ($SiO_2$) or aluminum oxide ($Al_2O_3$).

14. The display panel of claim 1, wherein regions corresponding to different sub-pixel colors have different sizes, shapes, or dimensions.

15. The display panel of claim 14, wherein a green sub-pixel has a larger size than a red sub-pixel, and the red sub-pixel has a larger size than a blue sub-pixel.

16. The display panel of claim 1, wherein regions corresponding to the sub-pixel colors comprise a round or rectangular shape.

17. The display panel of claim 1, in which the array of light emitting pixels comprises an interlocking format for the pixels, wherein the pixels are shaped to fit the interlocking format.

18. The display panel of claim 17, wherein the pixels comprise an L-shape.

19. A display panel comprising:
an array of light emitting pixels comprising red, blue and green light emitting sub-pixels;
a pixel in the array of light emitting pixels comprising an array of three blue light emitting solid-state devices, a spacer, and a light transmissive overlay placed over the array of solid-state light emitters; and wherein regions corresponding to red light emitting sub-pixels comprise a red light emitting photoluminescence material, regions corresponding to green light emitting sub-pixels comprise a green light emitting photoluminescence material and regions corresponding to blue light emitting sub-pixels comprise a light transmissive region.

20. The display panel of claim 19, wherein the photoluminescence material is included as fill material within the spacer.

* * * * *